(12) United States Patent
Costello

(10) Patent No.: US 8,721,348 B2
(45) Date of Patent: May 13, 2014

(54) DAUGHTER CARD ASSEMBLY HAVING A GUIDE ELEMENT

(75) Inventor: Brian Patrick Costello, Scotts Valley, CA (US)

(73) Assignee: Tyco Electronics Corporation, Berwyn, PA (US)

( * ) Notice: Subject to any disclaimer, the term of this patent is extended or adjusted under 35 U.S.C. 154(b) by 129 days.

(21) Appl. No.: 13/540,017

(22) Filed: Jul. 2, 2012

(65) Prior Publication Data

US 2014/0004723 A1    Jan. 2, 2014

(51) Int. Cl.
*H01R 12/00* (2006.01)

(52) U.S. Cl.
USPC .............................................. 439/64; 439/377

(58) Field of Classification Search
USPC ........... 439/59, 64, 374, 377, 540.1; 361/756, 361/786
See application file for complete search history.

(56) References Cited

U.S. PATENT DOCUMENTS

| 4,820,169 | A | 4/1989 | Weber et al. |
| 6,997,736 | B2 | 2/2006 | Costello et al. |
| 7,907,419 | B2 | 3/2011 | Costelio et al. |
| 8,323,049 | B2 * | 12/2012 | Ngo .............................. 439/552 |
| 8,366,485 | B2 * | 2/2013 | Johnescu et al. ......... 439/607.07 |

OTHER PUBLICATIONS

Impact Orthogonal Direct 5 Pair RAM Assmbly Top Guide Sales Drawings, Molex Incorporated. Jun. 2012.

* cited by examiner

*Primary Examiner* — Khiem Nguyen

(57) ABSTRACT

A daughter card assembly is proved that includes a circuit board having a leading edge and a board surface that extends to the leading edge. The daughter card assembly also includes a guide element that is mounted to the board surface of the circuit board. The guide element includes a wall portion that is mounted to the board surface and a receptacle arm. The receptacle arm extends from the wall portion generally parallel to, and spaced apart from, the board surface in a mating direction. The receptacle arm and the board surface define a connector-receiving space therebetween. The daughter card assembly also includes an electrical connector that is coupled to the circuit board and disposed in the connector-receiving space. The receptacle arm engages an alignment module associated with a mating connector as the electrical connector moves in the mating direction.

20 Claims, 3 Drawing Sheets

DAUGHTER CARD ASSEMBLY HAVING A GUIDE ELEMENT

BACKGROUND

The subject matter herein relates generally to daughter card assemblies configured to electrically couple to backplane circuit boards.

In some communication systems, a daughter card assembly is configured to engage a backplane assembly through a mating operation. The daughter card assembly typically includes a daughter card (e.g., circuit board) that has a plurality of electrical connectors mounted along a leading edge of the daughter card. The backplane assembly typically includes a backplane circuit board and multiple mating connectors mounted thereto. During the mating operation, the electrical connectors along the leading edge of the daughter card are advanced toward and engaged to corresponding mating connectors of the backplane assembly. The daughter card is oriented orthogonal to the backplane circuit board after the mating operation. In some communication systems, multiple daughter card assemblies are engaged to the same backplane assembly such that the daughter cards are oriented parallel to one another.

It is often desirable to increase the number of pathways that can transmit data signals through a communication system. With respect to daughter card assemblies, this may be accomplished by increasing the number of electrical connectors along the leading edge. However, at least some known daughter card assemblies utilize a guiding device that is positioned along the leading edge adjacent to an electrical connector. The guiding device consumes space along the leading edge that may otherwise be available for another electrical connector.

Accordingly, there is a need for a daughter card assembly having a guiding device that consumes less space along the leading edge of the daughter card.

BRIEF DESCRIPTION

In one embodiment, a daughter card assembly is proved that includes a circuit board having a leading edge and a board surface that extends to the leading edge. The daughter card assembly also includes a guide element that is mounted to the board surface of the circuit board. The guide element includes a wall portion that is mounted to the board surface and a receptacle arm. The receptacle arm extends from the wall portion generally parallel to, and spaced apart from, the board surface in a mating direction. The receptacle arm and the board surface define a connector-receiving space therebetween. The daughter card assembly also includes an electrical connector that is coupled to the board surface of the circuit board and disposed in the connector-receiving space. The electrical connector includes an engagement side that is located proximate to the leading edge and that faces in the mating direction. The engagement side is configured to engage a mating connector when the electrical connector is moved in the mating direction. The receptacle arm engages an alignment module associated with the mating connector as the electrical connector moves in the mating direction.

In another embodiment, a daughter card assembly is provided that includes a circuit board having a leading edge and a board surface that extends to the leading edge. The daughter card assembly also includes an electrical connector that is coupled to the circuit board and positioned proximate to the leading edge. The electrical connector has an elevated side that faces away from the board surface and defines a height of the electrical connector. The electrical connector has an engagement side that is configured to engage a mating connector when the electrical connector is moved in a mating direction. The daughter card assembly also includes a guide element that is coupled to and positioned on the board surface such that the electrical connector is mounted to an area of the board surface that is between the leading edge and the guide element. The guide element includes a receptacle arm that extends over and adjacent to the elevated side in the mating direction. The receptacle arm engages an alignment module associated with the mating connector as the electrical connector moves in the mating direction.

In another embodiment, a communication system is provided that includes a backplane assembly having a backplane circuit board. The backplane assembly also includes an alignment module, a power connector, and a mating connector that are coupled to the backplane circuit board. The communication system also includes a daughter card assembly configured to engage the backplane assembly. The daughter card assembly includes a daughter card having a leading edge and a signal connector mounted to the daughter card and located proximate to the leading edge. The signal connector is configured to engage the mating connector coupled to the backplane circuit board during a mating operation. The daughter card assembly also includes a power connector mounted to the daughter card and located proximate to the leading edge. The power connector of the daughter card assembly is configured to engage the power connector of the backplane assembly during the mating operation. The daughter card assembly also includes a guide element mounted to the daughter card. The guide element includes a receptacle arm that extends generally parallel to, and spaced apart from, the daughter card. The receptacle arm and the daughter card define a connector-receiving space therebetween, wherein one of the signal connector or the power connector of the daughter card assembly is disposed in the connector-receiving space. The receptacle arm engages the alignment module of the backplane assembly as the daughter card assembly moves toward the backplane assembly during the mating operation.

In yet another embodiment, a communication system is provided that includes a backplane circuit board and first and second daughter card assemblies configured to communicatively couple to the backplane circuit board. Each of the first and second daughter card assemblies includes a daughter card having a leading edge. The daughter card is orthogonal to the backplane circuit board when the respective daughter card assembly is communicatively coupled thereto. Each of the first and second daughter card assemblies also includes an electrical connector that is mounted to the daughter card and located proximate to the leading edge. The electrical connector is configured to engage a mating connector coupled to the backplane circuit board during a mating operation. At least one of the first or second daughter card assemblies includes a guide element that is mounted to the daughter card of said at least one of the first or second daughter card assemblies. The guide element includes a receptacle arm that extends generally parallel to the corresponding daughter card. The receptacle arm and the corresponding daughter card define a connector-receiving space therebetween. The electrical connector of said at least one of the first or second daughter card assemblies is disposed in the connector-receiving space.

DETAILED DESCRIPTION

Figure 1:
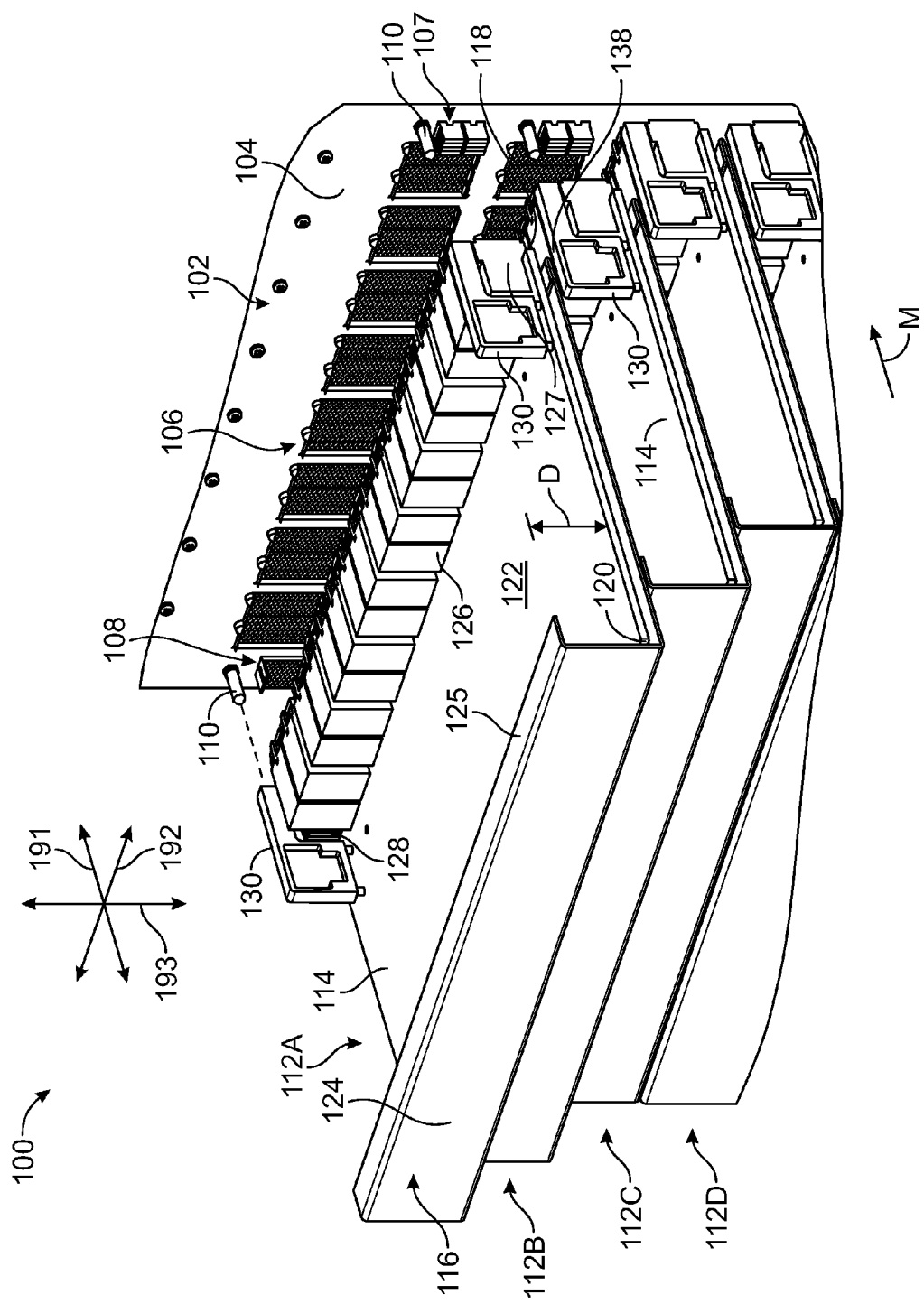
FIG. 1 is a perspective view of a communication system including a plurality of daughter card assemblies formed in accordance with one embodiment.

FIG. 1 is a perspective view of a communication system 100 formed in accordance with one embodiment. As shown, the communication system 100 is oriented with respect to mutually perpendicular axes 191-193, which include a mating axis 191, a lateral axis 192, and an orientation axis 193. The communication system 100 includes a backplane assembly 102 that has a backplane circuit board 104 and a plurality of electrical connectors 106-108 coupled to the backplane circuit board 104. The electrical connectors 106, 108 are configured to transmit data signals, and the electrical connectors 107 are configured to transmit power. The backplane assembly 102 also includes alignment modules 110. In the illustrated embodiment, the alignment modules 110 constitute pins that project away from backplane circuit board 104 along the mating axis 191.

The communication system 100 also includes a plurality of daughter card assemblies 112A-112D that are configured to engage the backplane assembly 102. Although the following is with specific reference to the daughter card assembly 112A, the daughter card assemblies 112B-112D may have identical or similar components and features. As shown, the daughter card assembly 112A may include a circuit board 114 and, optionally, a support frame 116 that is secured to the circuit board 114. To distinguish the circuit boards 104 and 114, the circuit board 114 is hereinafter referred to as the daughter card 114. As shown, the daughter card 114 has a leading edge 118, an opposite trailing edge 120, and a board surface 122 that extends between the leading and trailing edges 118, 120. The support frame 116 includes an operator-engaged side or panel 124 that may be gripped by an operator (e.g., individual or machine) during mating and unmating operations.

The daughter card assembly 112A also includes a plurality of electrical connectors 126-128 mounted to the daughter card 114 proximate to the leading edge 118. The electrical connectors 126-128 are right-angle connectors. To distinguish the electrical connectors 126-128 and the electrical connectors 106-108, the electrical connectors 106-108 are hereinafter referred to as the mating connectors 106-108. The electrical connectors 126-128 are positioned to face the backplane assembly 102 in a mating direction M that extends along mating axis 191. In the illustrated embodiment, the electrical connectors 126-128 clear the leading edge 118 (e.g., project beyond the leading edge 118 in the mating direction M). However, in other embodiments, the leading edge 118 of the daughter card 114 may be substantially flush with or be located in front of the electrical connectors 126-128. During a mating operation, the electrical connectors 126, 127, and 128 are aligned with the mating connectors 106, 107, and 108, respectively. The electrical connectors 126-128 are advanced toward the backplane assembly 102 in the mating direction M until the electrical connectors 126, 127, 128 engage and communicatively couple to the mating connectors 106, 107, and 108, respectively.

In the illustrated embodiment, the electrical connector 127 and the mating connector 107 are power connectors configured to transmit electrical power therebetween. As such, the electrical and mating connectors 127, 107 may also be referred to as power connectors. In the illustrated embodiment, the electrical connectors 126, 128 and the mating connectors 106, 108 are configured to transmit differential signals and, in particular, high-speed differential signals (e.g., greater than 10 Gbps). As such, the electrical connectors 106, 108, 126, 128 may also be referred to as signal connectors. By way of example, each of the electrical connectors 106, 108, 126, 128 may be similar to connectors in the STRADA Whisper® or Z-PACK TinMan® product lines developed by Tyco Electronics. In some embodiments, the high-speed signals are transmitted at 20 Gbps or more. However, although the communication system 100 is described with particular reference to high speed, differential-type systems, it is understood that embodiments described herein may be applicable to other types of electrical connectors.

The daughter card assembly 112A includes a guide element 130 that is mounted to the board surface 122 of the daughter card 114. In the illustrated embodiment, the daughter card assembly 112A includes two guide elements 130 that are located at opposite sides or wings of the daughter card assembly 112A. However, in other embodiments, only one guide element 130 or more than two guide elements 130 may be used. The guide elements 130 are configured to engage corresponding alignment modules 110 during the mating operation. The alignment modules 110 have fixed positions. Thus, when the guide elements 130 engage the alignment modules 110 during the mating operation, the daughter card assembly 112A is guided until the daughter card assembly 112A is suitably aligned and oriented relative to the backplane assembly 102.

In the illustrated embodiment, the alignment modules 110 constitute pins or posts that are received by open cavities 148 (FIG. 2) of the guide elements 130 during the mating operation. However, in alternative embodiments, the alignment modules 110 may include open cavities and the guide elements 130 may include pins or posts configured to be received by the open cavities.

In the illustrated embodiment, the guide element 130 is a modular part that is separate and distinct from the electrical connectors 126-128. For example, the guide element 130 is separately mountable and separately removable from the daughter card 114. As will be described in greater detail below, the guide element 130 may be used to align the daughter card assembly 112A without consuming space along the leading edge 118 that may otherwise be used by an electrical connector.

Figure 2:
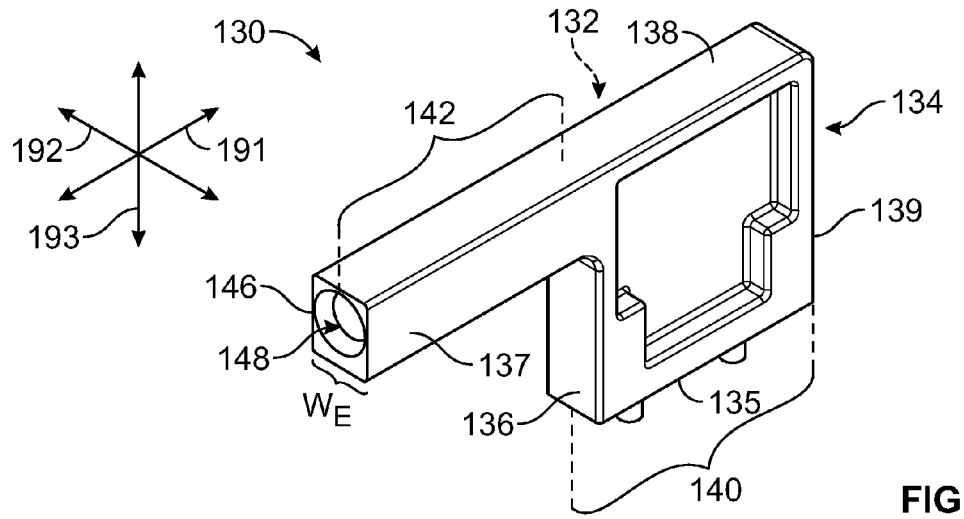
FIG. 2 is a perspective view of a guide element that may be used with the daughter card assemblies of FIG. 1.
Figure 3:
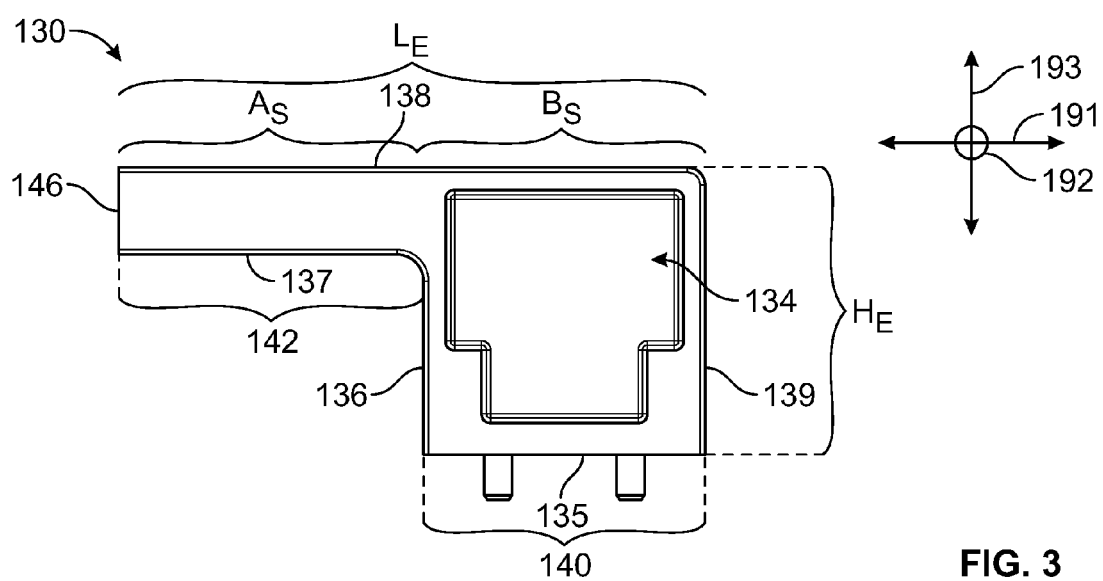
FIG. 3 is a side view of the guide element.

FIG. 2 is a perspective view of the guide element 130, and FIG. 3 shows a side view of the guide element 130. The guide element is oriented with respect to the mating axis 191, the lateral axis 192, and the orientation axis 193. The guide element 130 is defined by a sidewall 132 (FIG. 2), an opposite sidewall 134, and element edges 135-139 that extend between and join the sidewalls 132, 134. The sidewalls 132, 134 include a mounting edge 135, a forward-facing edge 136, an arm edge 137, an elevated edge 138, and a rear edge 139.

The guide element 130 includes a wall portion 140 and a receptacle arm 142 that is coupled to the wall portion 140 and extends away therefrom. When the guide element 130 is mounted to the board surface 122 (FIG. 1), the receptacle arm 142 extends generally parallel to the board surface 122 along the mating axis 191. The receptacle arm 142 extends from the wall portion 140 to a distal end 146 of the receptacle arm 142. As shown in FIG. 2, the receptacle arm 142 includes an open cavity 148. The open cavity 148 is sized and shaped to receive one of the alignment modules 110 (FIG. 1). In the illustrated embodiment, the open cavity 148 has a substantially circular cross-section. In alternative embodiments, the open cavity 148 may have a cross-section with any one of several different shapes (e.g., triangular or square).

In some embodiments, the guide element 130 is dedicated to providing a guidance mechanism for the corresponding daughter card assembly. For instance, the guide element 130 may be an independent part which is formed separately from any electrical connector or other device that is part of the corresponding daughter card assembly. The guide element 130 may be a unitary part having a molded or machined body that has the open cavity 148 and, optionally, the mounting cavities described below, without any additional components.

The guide elements 130 may be dimensioned to have at least one of a low profile or a narrow, upright configuration. Low profile guide elements may be used when it is desirable to stack the daughter card assemblies, such as the daughter card assemblies 112A-112D (FIG. 1), adjacent to each other in the communication system 100 (FIG. 1). An upright configuration may be used when it is desirable to reduce or eliminate lateral space that is consumed by the guide element 130 along the leading edge 118 (FIG. 1) while also providing a guidance mechanism for the corresponding daughter card assembly.

In particular embodiments, the guide element 130 has a low profile and a narrow, upright configuration. More specifically, the guide element 130 has an element length $L_E$ (FIG. 3) that is measured along the mating axis 191, an element width $W_E$ (FIG. 2) that is measured along the lateral axis 192, and an element height $H_E$ (FIG. 3) that is measured along the orientation axis 193. In the illustrated embodiment, each of the element height $H_E$ and the element length $L_E$ is greater than the element width $W_E$. By way of example, the element length $L_E$ may be at least five times greater than the element width $W_E$ or, more particularly, at least seven times greater than the element width $W_E$. The element height $H_E$ may be at least three times greater than the element width $W_E$ or, more particularly, at least four times greater than the element width $W_E$. In some embodiments, the element length $L_E$ is greater than the element height $H_E$. For example, the element length $L_E$ may be at least 1.5 times greater than the element height $H_E$ or, more particularly, at least about two times greater than the element height $H_E$.

Also shown, the element length $L_E$ includes an arm segment $A_S$ that corresponds to the receptacle arm 142 and a wall segment $B_S$ that corresponds to the wall portion 140. In some embodiments, the arm segment $A_S$ is at least equal to or greater than the wall segment $B_S$. For example, in the illustrated embodiment, the arm segment As is greater than the wall segment $B_S$.

Figure 4:
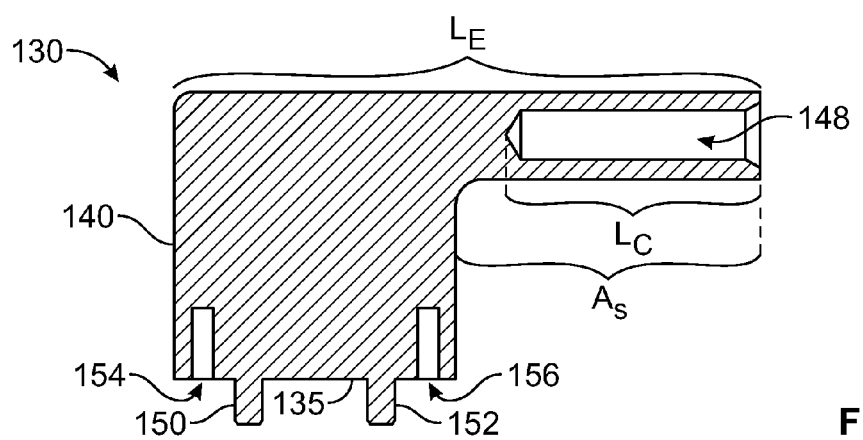
FIG. 4 is a cross-section of the guide element.

FIG. 4 illustrates a side cross-section of the guide element 130. As shown, the guide element 130 includes the open cavity 148, coupling features 150, 152, and mounting cavities 154, 156. The open cavity 148 and the mounting cavities 154, 156 are defined by respective interior surfaces of the guide element 130. The open cavity 148 has a length $L_c$ that extends along a majority of the arm segment $A_S$ of the length $L_E$. The mounting cavities 154, 156 extend into the wall portion 140 from the mounting edge 135, and the coupling features 150, 152 extend away from the mounting edge 135. In the illustrated embodiment, the coupling features 150, 152 are a continuous part of the wall portion 140. For example, the wall portion 140 and the coupling features 150, 152 may be molded with a common material. In the illustrated embodiment, the coupling features 150, 152 are located between the mounting cavities 154, 156. However, other arrangements of the coupling features 150, 152 and the mounting cavities 154, 156 may be used.

As described above, in alternative embodiments, the guide element 130 may include pins or posts (not shown) that are configured to be received by open cavities (not shown) of the backplane assembly 102 (FIG. 1). For example, the receptacle arm 142 may be shaped similar to the alignment module 110 as shown in FIG. 1. As such, the alternative receptacle arm 142 may not have the open cavity 148. In this alternative embodiment, the backplane assembly 102 may include an alignment module that has an open cavity that is similar to the open cavity 148. Yet in other embodiments, the daughter card assembly 112A (FIG. 1) may include the guide element 130 as shown in FIGS. 2-4 and an alternative guide element that includes the pin or posts as described above.

Figure 5:
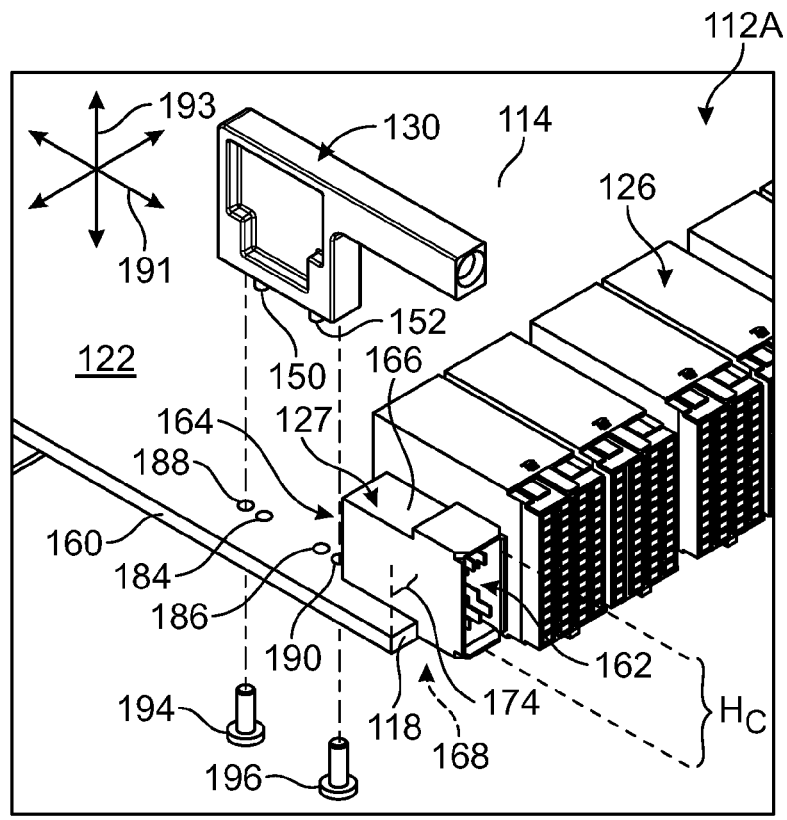
FIG. 5 is a partially exploded view of a portion of one of the daughter card assemblies of FIG. 1.

FIG. 5 is a partially exploded view of the daughter card assembly 112A. The electrical connectors 126, 127 are coupled (e.g., mounted) to the daughter card 114 proximate to the leading edge 118. In the illustrated embodiment, the electrical connectors 126, 127 clear and project beyond the leading edge 118. Also shown, the electrical connector 127 may be located proximate to a side edge 160 that extends generally parallel to the mating axis 191. An empty lateral space 174 may exist adjacent to the electrical connector 127. The lateral space 174 extends from the electrical connector 127 to the side edge 160. In some embodiments, the lateral space 174 may be reduced (e.g., minimized) so that a greater number of electrical connectors 126, 127, and/or 128 (FIG. 1) or other components may be coupled to the daughter card 114 along the leading edge 118. By way of example, the lateral space 174 may be substantially equal to or smaller than the width $W_E$ (FIG. 2) of the guide element 130. However, in other embodiments, the lateral space 174 may be larger.

As shown in FIG. 5, the electrical connector 127 includes an engagement side or face 162 and a rear side 164 that is opposite the engagement side 162. The engagement and rear sides 162, 164 face in opposite directions along the mating axis 191. The electrical connector 127 also includes an elevated side 166 and an opposite mounting side 168. The elevated and mounting sides 166, 168 face in opposite directions along the orientation axis 193. The elevated side 166 may define a height $H_C$ of the electrical connector 127. In other words, the elevated side 166 may include a highest part or portion of the electrical connector 127 with respect to the board surface 122. The mounting side 168 may include compliant contact ends or tails (not shown) that are inserted into plated thru-holes (not shown) of the daughter card 114. In the illustrated embodiment, the electrical connector 127 is substantially rectangular or block-shaped. However, different shapes may be contemplated in other embodiments.

When the guide element 130 is mounted to the daughter card 114, the coupling features 150, 152 may be inserted into holes 184, 186, respectively, of the daughter card 114 and frictionally engage the respective holes 184, 186 or, more specifically, interior surfaces that define the holes 184, 186. In some embodiments, the coupling features 150, 152 operate to hold the guide element 130 in a designated position so that fasteners 194, 196 (e.g., screws, pins, or plugs) may be inserted through holes 188, 190 of the daughter card 114 and into the mounting cavities 154, 156 (FIG. 4). The fasteners 194, 196 may secure or affix the guide element 130 to the daughter card 114. In other embodiments, the coupling features 150, 152 may be used to secure the guide element 130 to the daughter card 114 without the use of the fasteners 194, 196.

Figure 6:
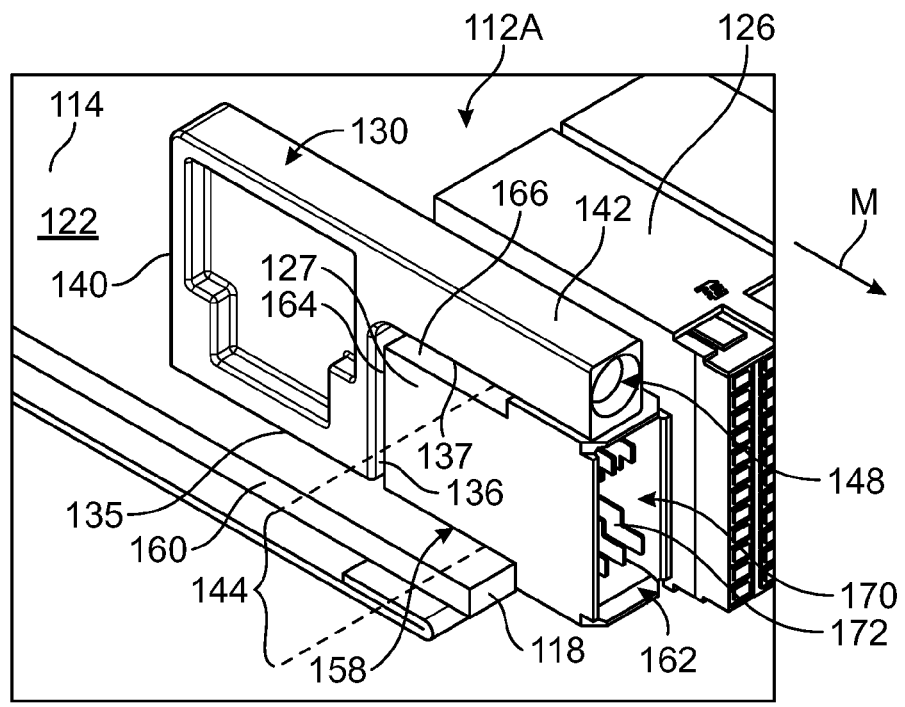
FIG. 6 is an enlarged view of one of the daughter card assemblies of FIG. 1.

FIG. 6 is an enlarged view of the daughter card assembly 112A after the daughter card assembly 112A is constructed. With respect to the electrical connector 127, the engagement side 162 faces in the mating direction M and is located proximate to the leading edge 118. As shown, the electrical connector 127 may include a contact cavity 170 that opens to the engagement side 162 and has electrical contacts 172 disposed therein. The engagement side 162 is configured to engage the corresponding mating connector 107 (FIG. 1) when the electrical connector 127 is moved in the mating direction M. The electrical contacts 172 are configured to mechanically engage and electrically couple to corresponding electrical contacts (not shown) of the mating connector 107.

As shown in FIG. 6, the mounting edge 135 of the guide element 130 is coupled to the daughter card 114. The wall portion 140 is mounted to and extends away from the board surface 122. The receptacle arm 142 extends from the wall portion 140 and generally parallel to the board surface 122. The receptacle arm 142 extends in the mating direction M. As shown, the receptacle arm 142 and the board surface 122 may define a connector-receiving space 144 therebetween. More specifically, the arm edge 137, the forward-facing edge 136, and the board surface 122 may define the connector-receiving space 144. In FIG. 6, the electrical connector 127 is coupled to the daughter card 114 and is disposed in the connector-receiving space 144.

Accordingly, the guide element 130 may be mounted to the board surface 122 such that the electrical connector 127 is mounted to an area 158 of the board surface 122 that is between the leading edge 118 and the guide element 130. In some embodiments, the receptacle arm 142 extends over and adjacent to the elevated side 166 in the mating direction M. The electrical connector 127 may be disposed directly between the receptacle arm 142 and the board surface 122 such that no other element or component exists within the connector-receiving space 144. The receptacle arm 142 may extend immediately adjacent to the elevated side 166 such that the receptacle arm 142 is abutting the elevated side 166. For example, the arm edge 137 may be in direct contact with at least a portion of the elevated side 166 or a small, nominal air gap or clearance may exist therebetween.

In some embodiments, when the guide element 130 is mounted to the daughter card 114, the forward-facing edge 136 of the wall portion 140 may face and be located immediately adjacent to the rear side 164 of the electrical connector 127. For example, the forward-facing edge 136 may be in direct contact with at least a portion of the rear side 164 or a small, nominal air gap or clearance may exist therebetween. However, in other embodiments, a larger gap may exist between the rear side 164 and the forward-facing edge 136.

During the mating operation, the open cavity 148 of the receptacle aim 142 may receive one of the alignment modules 110 (FIG. 1) that is associated with the corresponding mating connector 107 as the daughter card assembly 112A is moved in the mating direction M. In some cases, such as when the electrical and mating connectors 127, 107 are not aligned, interior surfaces that define the open cavity 148 may engage the alignment module 110. When the alignment modules 110 are in a fixed position, the daughter card assembly 112A may be guided to an aligned orientation. The engagement side 162 of the electrical connector 127 may then engage the mating connector 107. More specifically, electrical contacts 172 of the electrical connector 127 may mechanically and electrically engage electrical contacts (not shown) of the mating connector 107.

The above particularly describes the electrical connector 127 as being a power connector. However, embodiments are not limited to having a guide element positioned proximate to a power connector. For example, in other embodiments, a signal connector (e.g., the electrical connector 126) may be disposed in the connector-receiving space 144. The signal connector may have similar features as the electrical connector 127, such as the engagement side, the elevated side, the electrical contacts, the contact cavities, etc., described above. Accordingly, the guide element 130 is not limited to being positioned adjacent to a power connector, but may also be positioned adjacent to a signal connector.

Returning to FIG. 1, the daughter card assemblies 112A-112D may be dimensioned so that the daughter card assemblies 112A-112D can be stacked adjacent to each other. As shown in FIG. 1, the support frame 116 is coupled (e.g., affixed) to the daughter card 114. A top edge 125 of the operator-engaged side 124 may extend along the lateral axis 192 parallel to the leading edge 118 and orthogonal to the board surface 122. As shown in FIG. 1, the operator-engaged side 124 clears the board surface 122 by a distance D.

In some embodiment, the guide element 130 and/or the electrical connectors 126 have a low profile. For example, the height $H_E$ (FIG. 3) of the guide element 130 may be less than the distance D. As such, the daughter card assemblies 112A, 112B may be located immediately or directly adjacent to each other when coupled to the backplane circuit board 104. The guide element 130 of the daughter card assembly 112B extends between the daughter card 114 of the daughter card assembly 112A and the daughter card 114 of the daughter card assembly 112B. In some embodiments, the elevated edge 138 of the guide element 130 of the daughter card assembly 112B may be immediately adjacent to the support frame 116 (or the daughter card 114) of the daughter card assembly 112A. For example, in some embodiments, the support frame 116 (or the daughter card 114) of the daughter card assembly 112A and the guide element 130 of the daughter card assembly 112B may have a nominal air gap or clearance therebetween.

As used herein, an element or step recited in the singular and proceeded with the word "a" or "an" should be understood as not excluding plural of said elements or steps, unless such exclusion is explicitly stated. Furthermore, references to "one embodiment" or "an embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A daughter card assembly comprising:
a circuit board having a leading edge and a board surface that extends to the leading edge;
a guide element mounted to the board surface of the circuit board, the guide element including a wall portion that is mounted to the board surface and a receptacle arm, the receptacle arm extending from the wall portion generally parallel to, and spaced apart from, the board surface in a mating direction, the receptacle arm and the board surface defining a connector-receiving space therebetween; and
an electrical connector coupled to the board surface of the circuit board and disposed in the connector-receiving space, the electrical connector including an engagement side that is located proximate to the leading edge and that faces in the mating direction, the engagement side configured to engage a mating connector when the electrical connector is moved in the mating direction, wherein the receptacle arm engages an alignment module associated with the mating connector as the electrical connector moves in the mating direction.

2. The daughter card assembly of claim 1, wherein the electrical connector is disposed directly between the receptacle arm and the board surface.

3. The daughter card assembly of claim 1, wherein the electrical connector has an elevated side facing away from the board surface, the receptacle arm abutting the elevated side.

4. The daughter card assembly of claim 1, wherein the guide element is oriented with respect to mutually perpendicular axes that include a mating axis, a lateral axis, and an orientation axis, wherein the mating direction extends along the mating axis, the guide element having an element length measured along the mating axis, an element width measured along the lateral axis, and an element height measured along the orientation axis, wherein each of the element height and the element length is greater than the element width.

5. The daughter card assembly of claim 4, wherein the element length is greater than the element height.

6. The daughter card assembly of claim 4, wherein the element length includes an arm segment that corresponds to the receptacle arm and a wall segment that corresponds to the wall portion, the arm segment being at least equal to or greater than the wall segment.

7. The daughter card assembly of claim 1, wherein the receptacle arm includes an open cavity configured to receive the alignment module during the mating operation.

8. The daughter card assembly of claim 1, further comprising a support frame coupled to the circuit board, the support frame having an operator-engaged side that extends parallel to the leading edge and orthogonal to the board surface, the operator-engaged side clearing the board surface by a distance, wherein the guide element has a low profile such that the guide element has a height that is less than the distance.

9. A daughter card assembly comprising:
a circuit board having a leading edge and a board surface that extends to the leading edge;
an electrical connector coupled to the circuit board and positioned proximate to the leading edge, the electrical connector having an elevated side that faces away from the board surface and defines a height of the electrical connector, the electrical connector having an engagement side that is configured to engage a mating connector when the electrical connector is moved in a mating direction; and
a guide element coupled to and positioned on the board surface such that the electrical connector is mounted to an area of the board surface that is between the leading edge and the guide element, wherein the guide element includes a receptacle arm that extends over and adjacent to the elevated side in the mating direction, the receptacle arm engaging an alignment module associated with the mating connector as the electrical connector moves in the mating direction.

10. The daughter card assembly of claim 9, wherein the electrical connector is disposed directly between the receptacle arm and the board surface.

11. The daughter card assembly of claim 9, wherein the guide element is oriented with respect to mutually perpendicular axes that include a mating axis, a lateral axis, and an orientation axis, wherein the mating direction extends along the mating axis, the guide element having an element length measured along the mating axis, an element width measured along the lateral axis, and an element height measured along the orientation axis, wherein each of the element height and the element length is greater than the element width.

12. The daughter card assembly of claim 11, wherein the element length is greater than the element height.

13. The daughter card assembly of claim 11, wherein the element length includes an arm segment that corresponds to the receptacle arm and a wall segment that corresponds to the wall portion, the arm segment being at least equal to or greater than the wall segment.

14. The daughter card assembly of claim 9, wherein the guide element includes a mounting edge that is mounted to the board surface, the mounting edge including coupling features that frictionally engage holes of the circuit board.

15. The daughter card assembly of claim 9, further comprising a support frame coupled to the circuit board, the support frame having an operator-engaged side that extends parallel to the leading edge and orthogonal to the board surface, the operator-engaged side clearing the board surface by a distance, wherein the guide element has a low profile such that the guide element has a height that is less than the distance.

16. A communication system comprising:
a backplane assembly having a backplane circuit board, the backplane assembly including an alignment module, a power connector, and a mating connector that are coupled to the backplane circuit board; and
a daughter card assembly configured to engage the backplane assembly, the daughter card assembly comprising:
a daughter card having a leading edge;
a signal connector mounted to the daughter card and located proximate to the leading edge, the signal connector configured to engage the mating connector coupled to the backplane circuit board during a mating operation;
a power connector mounted to the daughter card and located proximate to the leading edge, the power connector of the daughter card assembly configured to engage the power connector of the backplane assembly during the mating operation; and
a guide element mounted to the daughter card, the guide element including a receptacle arm that extends generally parallel to, and spaced apart from, the daughter card, the receptacle arm and the daughter card defining a connector-receiving space therebetween, wherein one of the signal connector or the power connector of the daughter card assembly is disposed in the connector-receiving space, the receptacle arm engaging the alignment module of the backplane assembly as the daughter card assembly moves toward the backplane assembly during the mating operation.

17. The communication system of claim 16, wherein said one of the signal connector or the power connector of the daughter card assembly is disposed directly between the receptacle arm and the board surface.

18. The communication system of claim 16, wherein the guide element is oriented with respect to mutually perpendicular axes that include a mating axis, a lateral axis, and an orientation axis, wherein the mating direction extends along the mating axis, the guide element having an element length measured along the mating axis, an element width measured along the lateral axis, and an element height measured along the orientation axis, wherein each of the element height and the element length is greater than the element width.

19. The communication system of claim 18, wherein the element length is greater than the element height.

20. The communication system of claim 18, wherein said one of the signal connector or the power connector has an elevated side facing away from the board surface, the receptacle arm abutting the elevated side.

* * * * *